United States Patent
Spence

(10) Patent No.: US 7,120,285 B1
(45) Date of Patent: Oct. 10, 2006

(54) METHOD FOR EVALUATION OF RETICLE IMAGE USING AERIAL IMAGE SIMULATOR

(75) Inventor: Christopher A. Spence, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/515,348

(22) Filed: Feb. 29, 2000

(51) Int. Cl.
*G06K 9/46* (2006.01)
*G06K 9/68* (2006.01)

(52) U.S. Cl. .................................................. 382/144
(58) Field of Classification Search ................ 352/144, 352/145, 149, 151
See application file for complete search history.

(56) References Cited

U.S. PATENT DOCUMENTS

| | | | | |
|---|---|---|---|---|
| 4,238,780 | A | 12/1980 | Doemens | 340/146.3 |
| 5,086,477 | A | 2/1992 | Yu et al. | 382/8 |
| 5,795,688 | A | 8/1998 | Burdorf et al. | 430/30 |
| 5,815,685 | A * | 9/1998 | Kamon | 716/21 |
| 6,072,897 | A | 6/2000 | Greenberg et al. | 382/144 |
| 6,081,659 | A * | 6/2000 | Garza et al. | 716/21 |
| 6,091,845 | A * | 7/2000 | Pierrat et al. | 382/144 |
| 6,128,403 | A | 10/2000 | Ozaki | 382/145 |
| 6,175,953 | B1 | 1/2001 | Scepanovic et al. | 716/21 |
| 6,263,292 | B1 * | 7/2001 | Fiekowsky | 702/95 |
| 6,334,209 | B1 | 12/2001 | Hashimoto et al. | 716/21 |
| 6,477,265 | B1 * | 11/2002 | Sheng | 382/145 |
| 6,757,645 | B1 * | 6/2004 | Chang et al. | 703/13 |

OTHER PUBLICATIONS

Evaluation of Proximity Effect Using Three-Dimensional Optical Lithography Simulation, Chris A. Mack, SPIE vol. 2726 Optical Microlithography IX (1996).
Comparison of Binary Mask Defect Printability Analysis Using Virtual Stepper System and Aerial Image Microscope System, Khoi A. Phan, et al., Proc. SPIE vol. 3873, p. 681-692, 19th Annual Symposium on Photomask Technology, Frank E. Abboud; Brian J. Grenon; Eds. (Dec. 1999).

* cited by examiner

*Primary Examiner*—Brian Werner
(74) *Attorney, Agent, or Firm*—Renner, Otto, Boisselle and Sklar, LLP

(57) ABSTRACT

A method of evaluating a wafer structure formation process includes extracting the outline of an actual mask pattern, and simulating a lithographic process using the actual mask pattern to obtain a simulated wafer structure. The extracting the outline of the actual mask pattern may include, for example, imaging the actual mask using a scanning electron microscope (SEM). A second simulated wafer structure may also be obtained, by simulating the lithographic process using the ideal mask pattern design that was used in producing the actual mask pattern. Thus the relative contribution of mask pattern effects to overall wafer proximity effects may be evaluated by comparing the two simulated wafer structures, either with each other or against a benchmark such as a desired, ideal structure. This information may then be used to generate optical proximity correction (OPC) mask designs which compensate for mask patterning errors and give better wafer performance. The simulated wafer structures may be overlaid upon one another to allow for a direct comparison and full analysis of CD variations.

19 Claims, 13 Drawing Sheets

METHOD FOR EVALUATION OF RETICLE IMAGE USING AERIAL IMAGE SIMULATOR

TECHNICAL FIELD

The present invention generally relates to the field of semiconductor wafer manufacturing and more particularly to the field of evaluation and simulation of semiconductor wafer manufacturing processes.

BACKGROUND OF THE INVENTION

Referring initially to FIG. 1a, integrated circuits are formed on a semiconductor wafer 10 typically made from silicon. The wafer 10 is substantially round and typically has a diameter of approximately 15 to 20 cm. Each wafer 10 is divided up into individual circuit dies 15 which contain an integrated circuit. Since a single integrated circuit die 15 is often no more than 1 cm², a great many integrated circuit dies 15 can be formed on a single wafer 10. After the wafer 10 has been processed to form a number of integrated circuit dies on its surface, the wafer 10 is cut along scribe lines 20 to separate the integrated circuit dies for subsequent packaging and use.

The structure of the dies (the wafer structure) is formed by a wafer manufacture process 21, which is generally outlined in FIG. 1b. In step 22, a mask or reticle design is made with the ultimate goal of attaining the desired wafer structure. The design is used in fabricating a mask or reticle in step 23. Finally, in step 24, the wafer is fabricated using a lithographic process such a photolithographic process is used to transfer the pattern of the mask or reticle to the wafer. In general, lithography refers to processes for pattern transfer between various media. The basic photolithography system consists of a light source, a photomask containing the pattern to be transferred to the wafer, a collection of lenses, and a means for aligning existing patterns on the wafer with patterns on the photomask. (The terms "mask" and "photomask," as used herein, are intended to include both masks and reticles.)

Referring to FIG. 1c, during an intermediate stage in the manufacturing cycle, the wafer 10 is shown to include a film 25 which overlies the wafer 10 and a resist 30 deposited over the film 25. Exposing the resist 30 to light or radiation from a light source 32 of an appropriate wavelength, through a photomask 34, causes modifications in the molecular structure of the resist polymers to allow for transfer of the pattern from the photomask to the resist 30. The modification to the molecular structure allows a resist developer to dissolve and remove the resist in exposed areas, presuming a positive resist is used. If a negative resist is used, the developer removes the resist in the unexposed areas.

Referring to FIG. 1d, once the resist 30 on the wafer has been developed, one or more etching steps take place which ultimately allow for transferring the desired pattern to the wafer 10. For example, in order to etch the film 25 deposited between the resist 30 and the wafer 10, a wet or dry etchant is applied over the patterned resist 30. The etchant comes into contact with the underlying film layer by passing through openings 35 in the resist formed during the resist exposure and development steps. Thus, the etchant serves to etch away those regions of the film layer which correspond to the openings in the resist, thereby effectively transferring the pattern in the resist to the film layer as illustrated in FIG. 1e. In subsequent steps, the resist is removed and another etchant may be applied over the patterned film layer to transfer the pattern to the wafer or to another layer in a similar manner.

As performance demands in the semiconductor industry continue to increase, so does the device density of the patterns formed on the wafer. Accordingly, the line width, line space, and the size of contact holes (e.g. vias) have all significantly decreased such that controlling the critical dimensions (CDs) of features formed on a semiconductor wafer has become increasingly difficult. In order to maintain the integrity of the manufacture process it is very important to keep CD variations within a tolerable range. For this reason, various methods have been developed to measure CD variations in accordance with a selected figure of merit (FOM).

FOMs correspond to the criteria by which structures formed on the wafer are analyzed to determine how similar such structures are to the desired structure. Based on the outcome of such analysis, modifications in the mask design, the mask fabrication process, and/or the lithographic process, may be made in order to compensate for measured CD variations, thereby providing for more optimum chip design. For example, variations may be made to the lenses and/or mask patterns to account for measured CD variations.

One of the most common FOMs utilized today is a measurement of line width of a structure. For example, referring to FIG. 2, an image of a structure 50 is shown. The image of the structure 50 was obtained using a device such as a scanning electron microscope (SEM) which is known to provide high resolution images of structures formed on the wafer. As a basis for evaluating CD variations of the structure 50, a line width LW1 of the structure 50 is measured at a selected location approximately halfway between ends of the structure 50. The measured line width LW1 is then compared to a desired line width stored in memory to determine CD variations. Unfortunately, however, as can be seen from FIG. 2, the line width of the structure 50 may vary from one location to another. For example, the line width is narrower at some locations and wider at others. Accordingly, by measuring the line width of a structure at a selected location using SEM images, only a limited amount of information is obtained concerning the full extent of CD variations which may have occurred during the lithographic process.

Another method for determining the line width of a structure is known as the electrical line width measurement (ELM) technique. In accordance with ELM, the resistance of structures formed on the wafer is measured during application of a known amount of current. By comparing the resistance of a structure measured using ELM with an expected resistance of an optimally formed structure, an estimation of line width variation can be made. Unfortunately, while the information provided from implementation of the ELM technique is useful in monitoring CD variations, such information also fails to provide a full and accurate understanding of the precise nature of CD variations occurring in each structure. Various other CD variation calculation techniques are also known. However, it will be appreciated that depending on the FOM selected as a basis for CD analysis, an outcome of the analysis may provide incomplete and/or varying results.

Accordingly, there is a strong need in the art for a method and apparatus for quickly and easily analyzing the full extent of CD variations occurring across structures formed on semiconductor wafers.

Further, it is known that the pattern on the mask or reticle is always somewhat degraded compared with the designs generated by a designer. For example, some mask generation processes, such as use of laser pattern generators, tend to produce masks with rounded corners. Thus complex, sharply defined mask shapes produced by a designer, for example with features included for optical proximity correction (OPC), may not be accurately reproduced in mask designs. This suggests that mask designs with OPC require specialized mask generation processes, such as high-voltage e-beam pattern generation. However, use of such specialized processes may increase costs, and therefore in evaluating a mask generation process it would be desirable to evaluate the impact on the resulting wafer structure of the degradation of design due to mask formation.

SUMMARY OF THE INVENTION

A method of evaluating a wafer structure formation process includes extracting the outline of an actual mask pattern, and simulating a lithographic process using the actual mask pattern to obtain a simulated wafer structure. The extracting the outline of the actual mask pattern may include, for example, imaging the actual mask using a scanning electron microscope (SEM). A second simulated wafer structure may also be obtained, by (simulating the lithographic process using the ideal mask pattern design that was used in producing the actual mask pattern. Thus the relative contribution of mask pattern effects to overall wafer proximity effects may be evaluated by comparing the two simulated wafer structures, either with each other with respect to a benchmark such as a desired, ideal target layer structure on the wafer. This information may then be used to generate optical proximity correction (OPC) mask designs which compensate for mask patterning errors and give better wafer performance. The simulated wafer structures may be overlaid upon one another to allow for a direct comparison and full analysis of CD variations. Simulated structures from different wafer layers may also be overlaid upon one another.

In order to obtain a simulated wafer structure from the outline of an actual mask pattern, the image data of the actual mask pattern may be converted to a format compatible with a computer program or other algorithm for performing a simulation of the lithographic process. For example, an image analysis program may be applied to the image data in order to detect edges of structures in the image data and transform the image data into data which is compatible with the simulation program. Similarly, mask design data may be converted into a format compatible with a computer program or other algorithm for performing a simulation of the lithographic process.

An exemplary computer program for simulating the lithographic process is a program for performing an aerial image simulation or transformation. For example, an aerial transformation may be performed on the design data to take into account anticipated CD variations which are caused by lens aberrations. The aerial transformations may be performed in accordance with known simulation packages for anticipating the effects of lens aberrations during the lithographic transfer process.

Simulated wafer structure data may be loaded into a design viewer used to view the data. The simulated wafer structures may be automatically aligned and overlaid with one another to thereby provide a direct comparison between the simulated wafer structures. Accordingly, an operator is able to visually compare the precise critical dimension variations which have occurred at all points on the structure formed on the wafer in an efficient manner.

In addition to the visual comparison, the operator is provided with various menu options according to which the simulated wafer structures may be evaluated. For example, the menu options may provide for selecting among various figures of merit (FOM) according to which CD variations are to be automatically analyzed and computed. Further, the menu options may provide for determining the location of the greatest CD variation, manually re-aligning the overlaid images, magnifying one or both images, etc. The operator is thereby provided with a convenient and comprehensive tool with which to fully analyze CD variations of structures formed on the wafer.

According to an aspect of the invention, a method of analyzing a wafer manufacturing process includes the steps of imaging at least a portion of a mask to be used in the wafer structure formation process, and simulating lithographic processing using data received from or derived from the imaging of the portion of the mask, thereby obtaining a simulated wafer structure.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
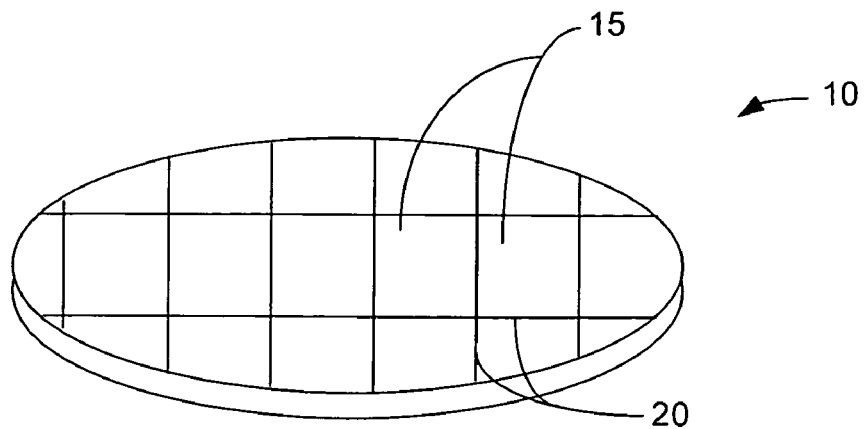
FIG. 1a is an isometric view of a prior art semiconductor wafer having a circuit die formed thereon.
Figure 1B:
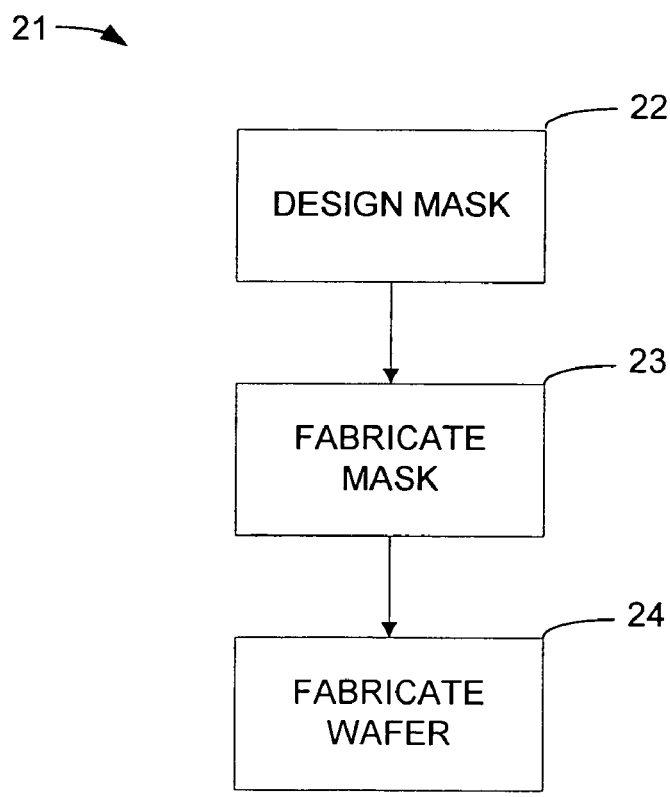
FIG. 1b is a flow chart of a wafer structure formation process.
Figure 1C:
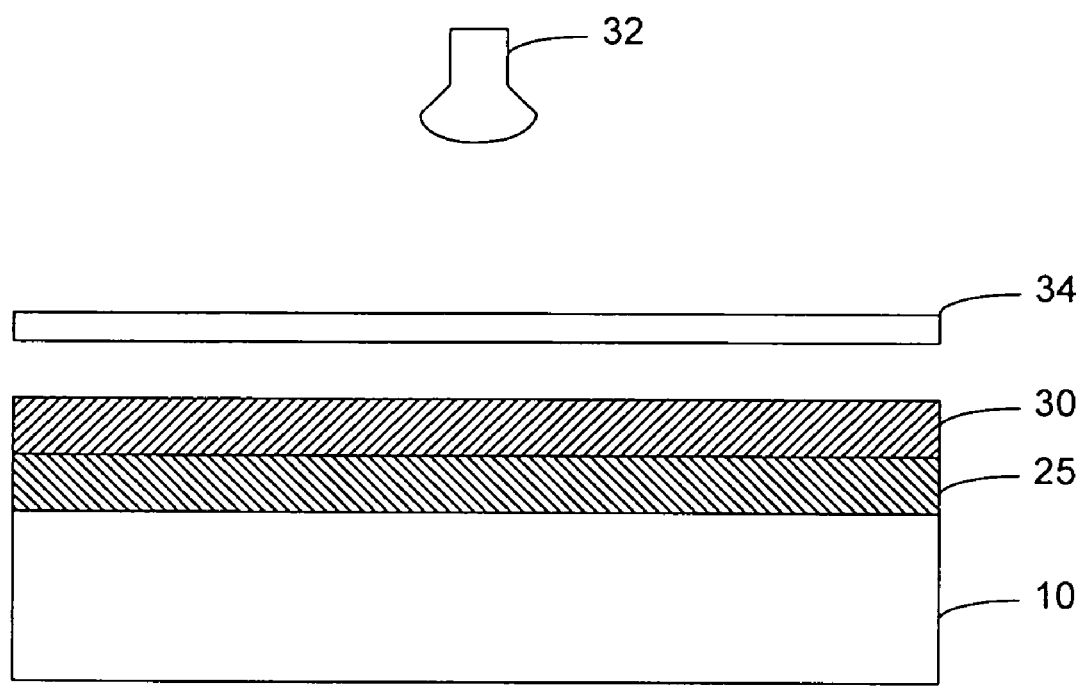
FIG. 1c is a partial cross section illustrating a prior art semiconductor wafer having a film overlaying the wafer which in turn is covered by a resist layer.
Figure 1D:
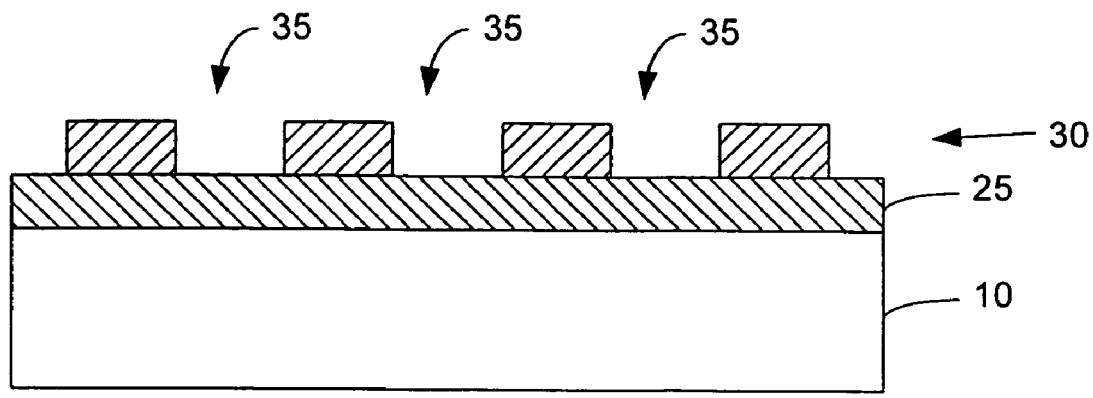
FIG. 1d is a partial cross section illustrating the resist layer of FIG. 1b after being developed.
Figure 1E:
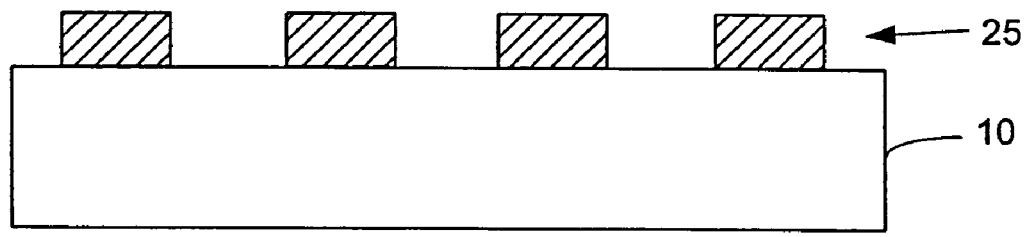
FIG. 1e is a partial cross section illustrating the film layer of FIG. 1c after being etched.
Figure 2:
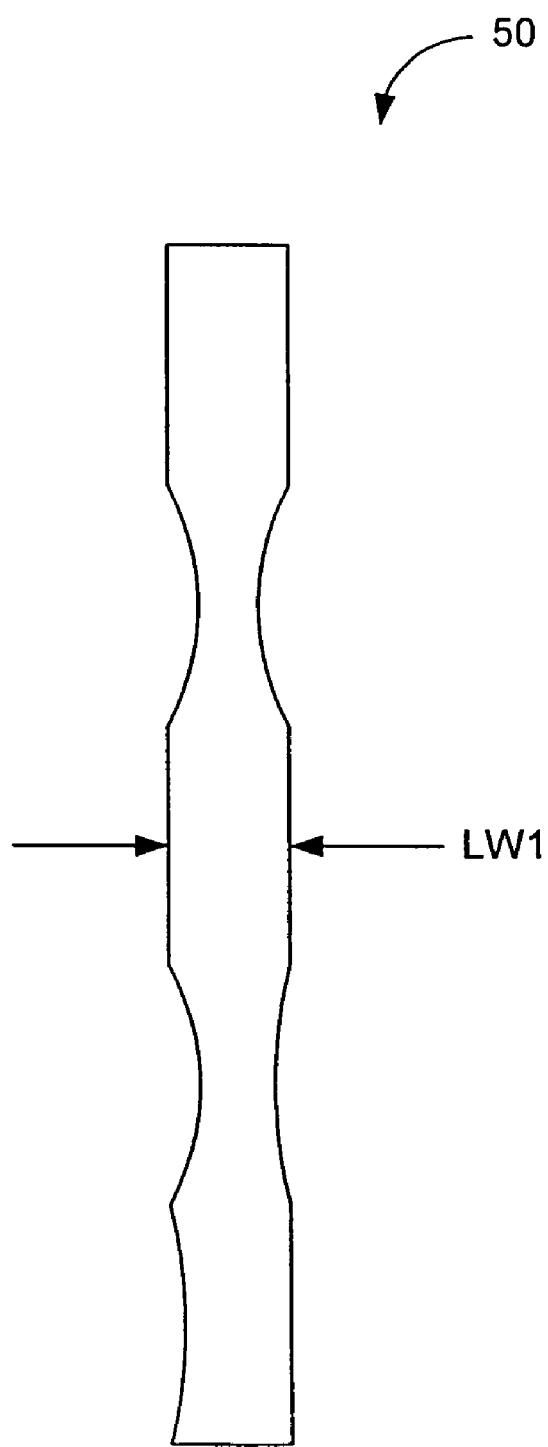
FIG. 2 is an example of a prior art method of calculating a critical dimension of a structure formed on a semiconductor wafer.
Figure 3:
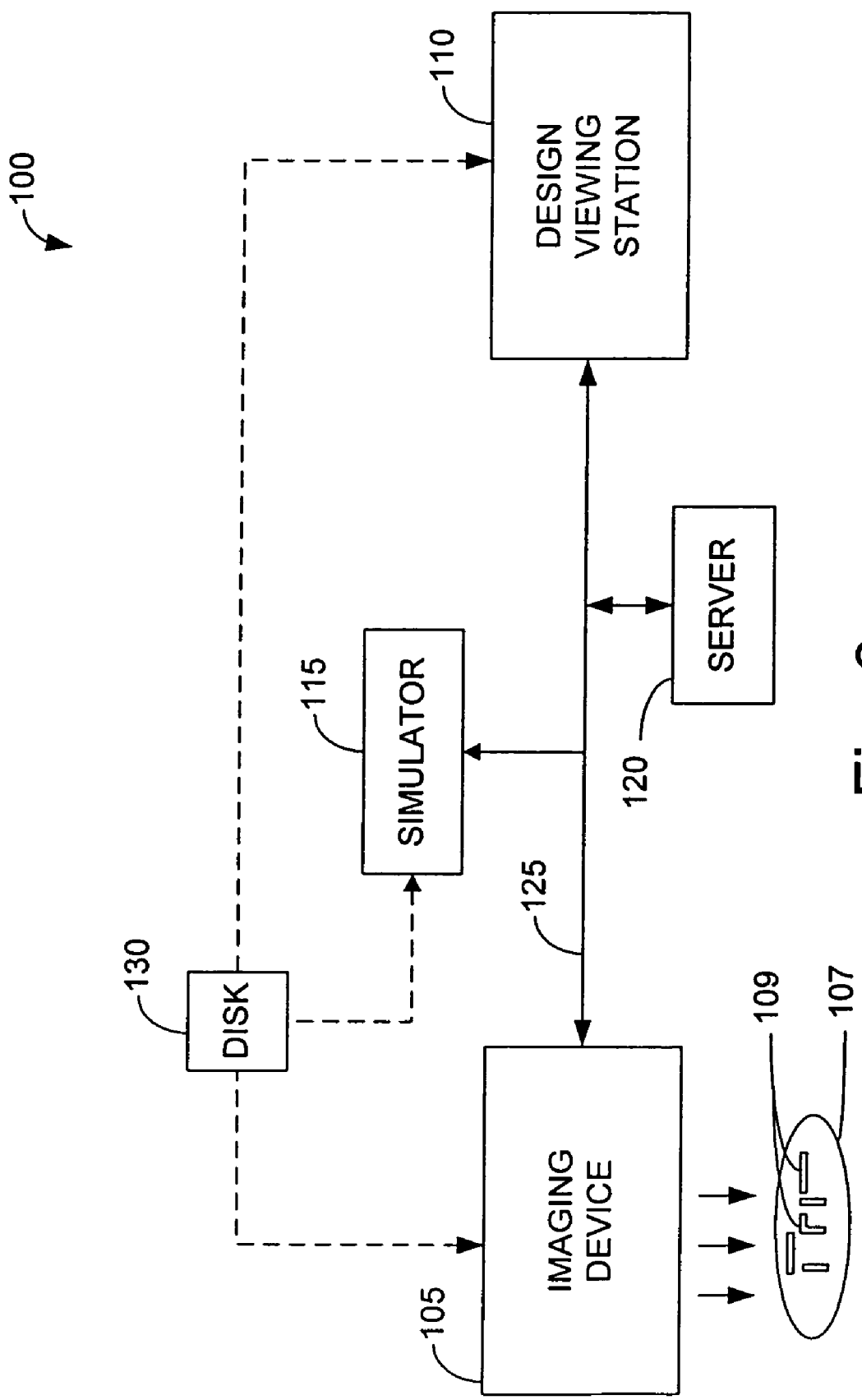
FIG. 3 is an overview of a pattern analysis and simulation system in accordance with the present invention.

Referring to FIG. 3, an overview of a pattern analysis and simulation system 100 in accordance with the present embodiment of the invention is depicted. The system 100 includes an imaging device 105 for imaging a mask 107 having a plurality of structures or features 109 (a "pattern") formed thereon, a viewing station 110, a lithography process simulator 115, and a server 120. A network connection 125 such as a local area network couples together the imaging device 105, the viewing station 110, and/or the simulator 115, to allow data to be communicated therebetween. The server 120 facilitates data communication across the network connection 125 in a conventional manner. It will be appreciated, however, that alternatively the imaging device 105, the viewing station 110, and/or the simulator 115 may not be connected via the network connection 125. In such a case, data may be transferred between the imaging device 105, the viewing station 110, and/or the simulator 115, via a disk 130, wireless interface, etc.

As will be described in more detail below, the present invention provides for overlaying 1) a first simulated wafer structure, simulating the wafer structure resulting from a lithographic process utilizing the mask 107, the simulation utilizing image data or information derived from the pattern 109 formed on the mask 107 as an input for the simulator 115, and 2) a second simulated wafer structure, simulating the wafer structure resulting from a lithographic process, wherein the simulation utilizes mask design data as an input for the simulator 115. In order to utilize the image data or information as an input for the simulator 115, the image data or information may be transformed to a format compatible for viewing on a design viewer used to observe the design data. For example, the image data may be transformed by application of a pattern recognition program which serves to detect edges of structures in the image data and produce a graphical or other data file compatible for use by the simulator 115. By overlaying the two simulated wafer structures, a complete comparison of critical dimension (CD) variations of the simulated wafer structures may be observed and analyzed by an operator. Further, menu driven options may be provided to the operator in order to invoke automatic CD variation calculations in accordance with a selected figure of merit (FOM). In this manner, the operator is provided with a convenient and easy to use system for analyzing the full extent of CD variations occurring on the semiconductor wafer.

Further design data of a desired wafer structure may be overlaid on one or both of the simulated wafer structures, enabling complete comparison of CD variations between the desired wafer structure and one or both of the simulated wafer structures.

Figure 4:
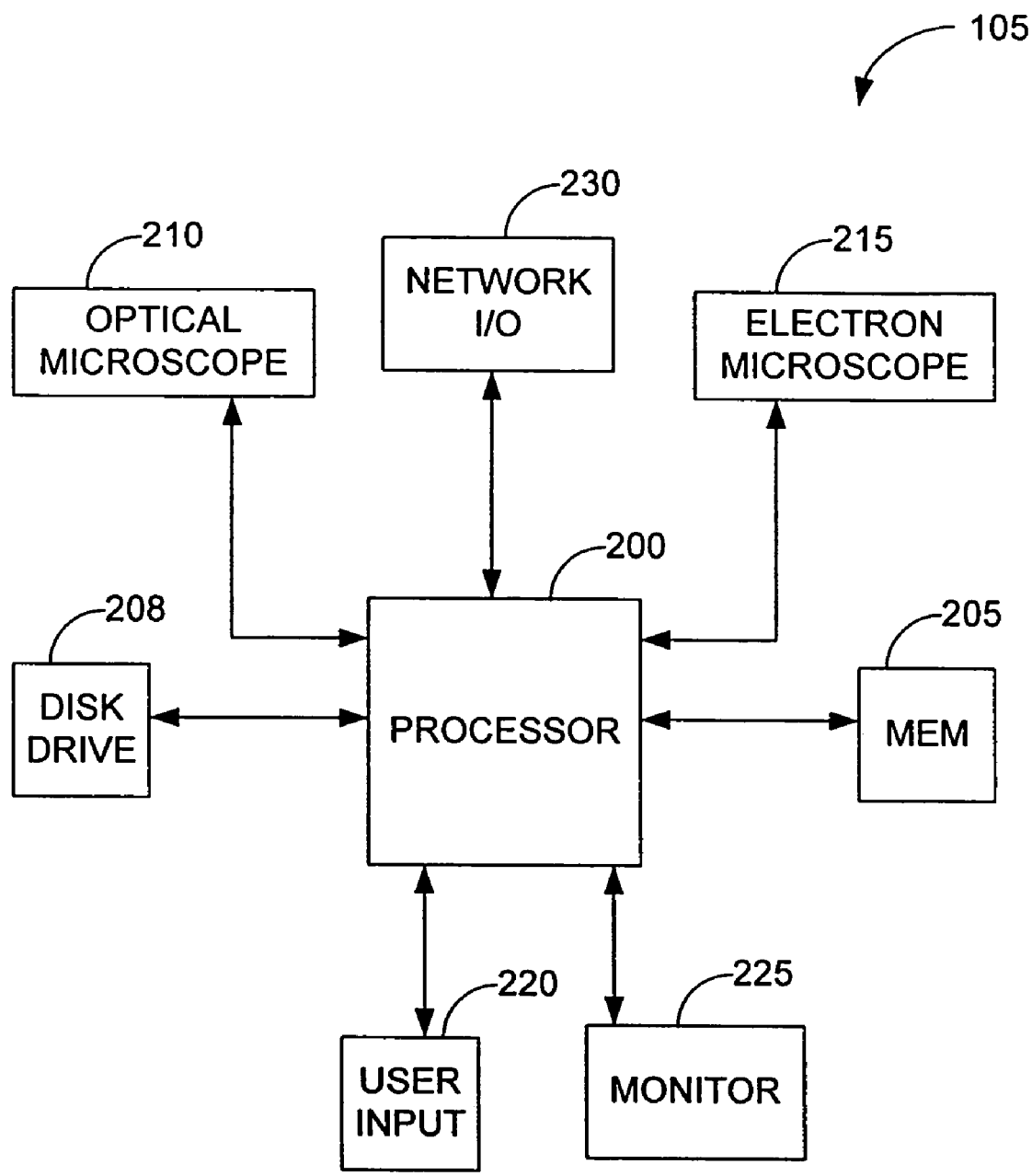
FIG. 4 is a block diagram of hardware components associated with an imaging device in accordance with the present invention.

Referring now to FIG. 4, a block diagram of the imaging device 105 is shown. The imaging device 105 may be a scanning electron microscope (SEM) such as SEM commercially available from KLA-TENCOR, San Jose, Calif. The imaging device 105 includes a processor 200 for carrying out the operations described herein. The processor 200 may, for example be an ADVANCED MICRO DEVICES (AMD) ATHLON processor, an INTEL PENTIUM III processor, or other suitable processor. Coupled to the processor 200 is a memory 205. As discussed in more detail below, in addition to standard operating code and other data, the memory 205 may have stored therein an image analysis program which serves to transform image data obtained from the imaging device 105 to a format suitable for use by the simulator 115. A disk drive 208 is also shown to be coupled to the processor 200 and serves in a conventional manner for retrieving and storing information from/to the disk 130 (FIG. 3). It will be appreciated that other suitable imaging devices, for example an atomic force microscope (AFM) or an optical microscope, may alternatively be used.

Also coupled to the processor 200 is an optical microscope 210 and an electron microscope 215. The optical microscope 210 provides a user with an option of viewing a magnified image of a portion of the mask 107 within a field of view of the optical microscope 210. The electron microscope 215 provides a user with an image of the mask 107 produced using conventional scanning electron microscope imaging techniques.

A user input 220 and a monitor 225 are each coupled to the processor 200 and provide a user with access and control for viewing image data obtained from the imaging device 105. In the present embodiment, the user input 220 is a keyboard while the display device 225 is an SVGA color monitor. Of course, various other user inputs 220 and monitors 225 could be used including, for example, a touch screen display. A network I/O 230 is also shown connected to the processor 200 and provides for bi-direction coupling of the imaging device 105 to the network connection 125 in a conventional manner.

Figure 5:
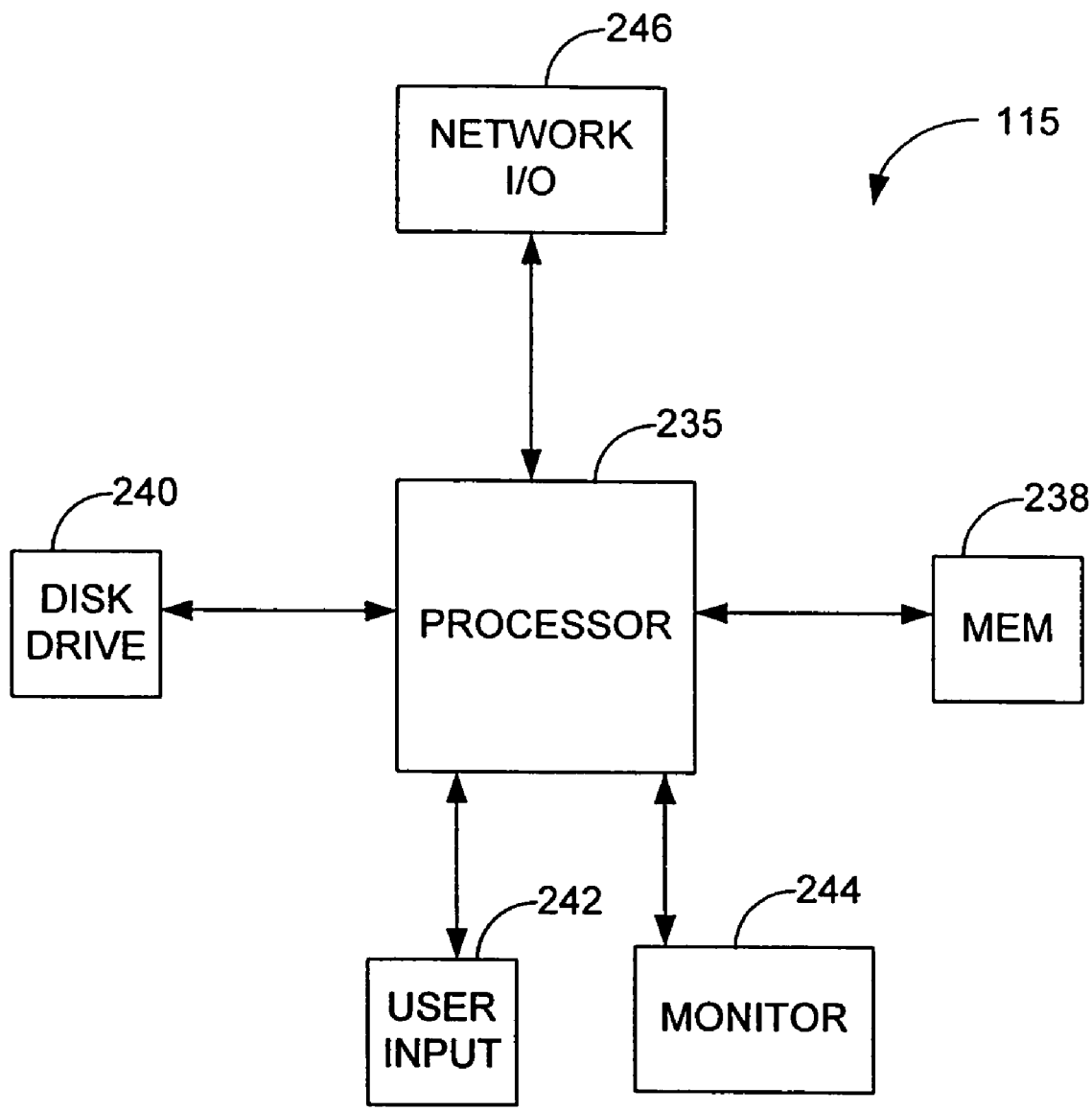
FIG. 5 is a block diagram of hardware components associated with a simulator in accordance with the present invention.

Referring now to FIG. 5, a block diagram is depicted of hardware components associated with the simulator 115. The simulator 115 includes a processor 235 for performing and carrying out various of the functions described herein. The processor 235 may, for example, be an ADVANCED MICRO DEVICES (AMD) ATHLON processor, an INTEL PENTIUM III processor, or other suitable processor. Coupled to the processor 235 is a memory 238. The memory 238 serves to store design files, data from the imaging device 105, software for carrying out the functions, such as the wafer fabrication simulation described herein, and other operating software and data. A disk drive 240 is also shown to be coupled to the processor 235 and serves in a conventional manner for retrieving and storing information to and from the disk 130 (FIG. 3).

A user input 242 and a monitor 244 are also coupled to the processor 235. The user input 242 and the monitor 244 may be similar to those described elsewhere herein with respect to other components of the system 100. A network input/output (I/O) connector 246 coupled to the processor 235 provides an interface between the simulator 115 and the network connection 125.

Figure 6:
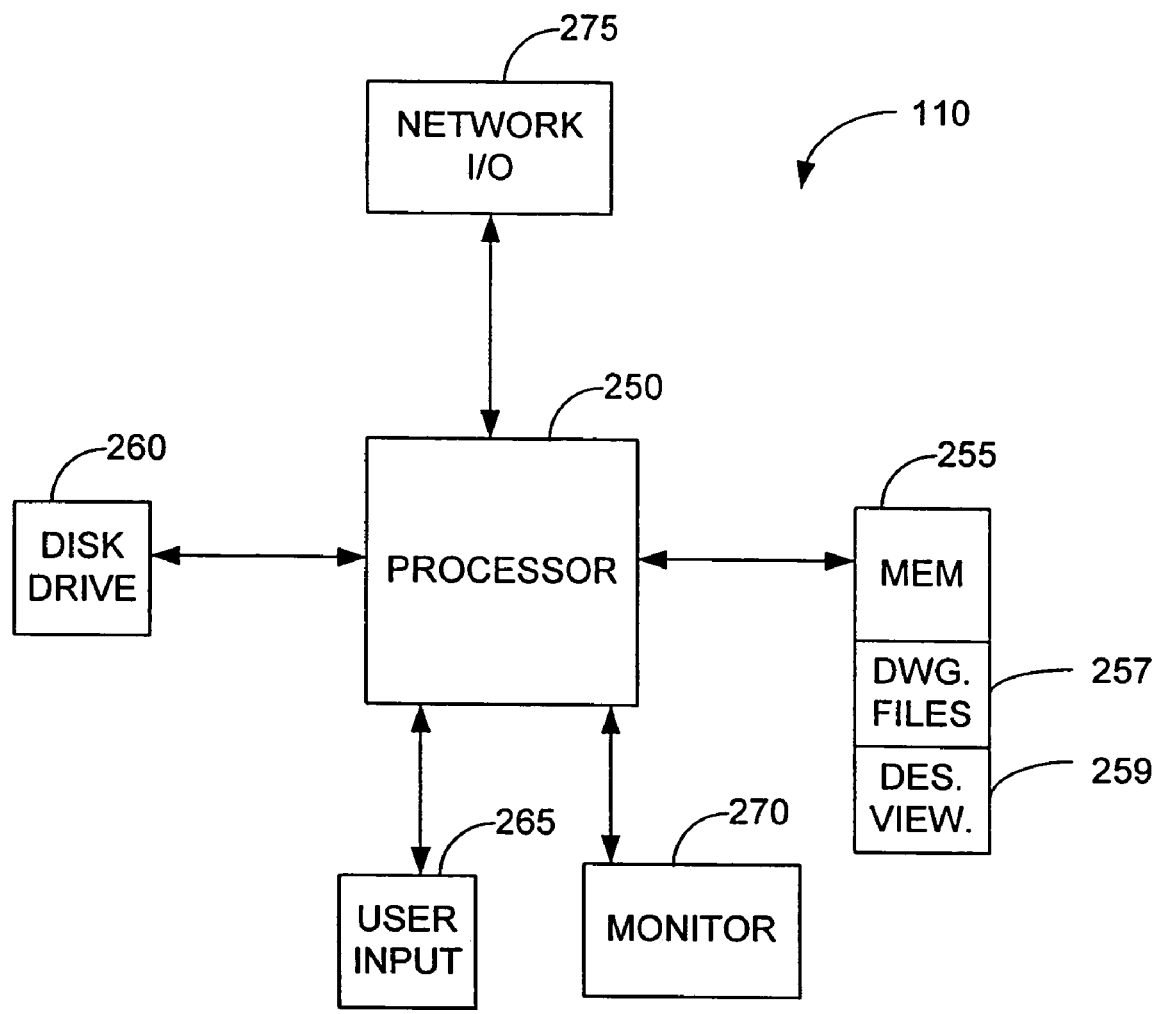
FIG. 6 is a block diagram of hardware components associated with a viewing station in accordance with the present invention.

Turning now to FIG. 6, a block diagram of hardware components associated with the viewing station 110 is depicted. The viewing station 110 includes a processor 250 for performing and carrying out the various functions described herein. The processor 250 may, for example, be an ADVANCED MICRO DEVICES (AMD) ATHLON processor, an INTEL PENTIUM III processor, or other suitable processor. Coupled to the processor 250 is a memory 255. The memory 255 serves to store CAD drawing files 257, design viewer software 259 and other operating software and data. A disk drive 260 is also shown to be coupled to the processor 250 and serves in a conventional manner for retrieving and storing information to and from the disk 130 (FIG. 3).

Continuing to refer to FIG. 6, a user input 265 and a monitor 270 are also coupled to the processor 250 of the viewing station 110. In the present embodiment, the user input 265 includes a combination of a keyboard and a computer mouse. However, it will be appreciated that other conventional user input devices may alternatively be used. The monitor 270 is preferably an SVGA monitor having a display screen size of 480×640 pixels although other monitors could also be used. A network input/output (I/O) connector 275 coupled to the processor 250 provides an interface between the viewing station 110 and the network connection 125.

As described briefly above, and in greater detail below, the imaging device 105 functions to acquire an image or other data regarding a mask pattern. The simulator 115 uses image or other data as an input to create a first simulated wafer structure. The simulator 115 may also be able to create simulated wafer structures using design data as an input, for example essentially simulating wafer fabrication with an ideal mask pattern. The view station 110 allows display of one or more simulated, ideal, and/or actual wafer structures, and comparison of structures with one another or with some reference, such as a desired wafer structure. For example critical dimensions or other metrics (for example, common overlapping area) of the wafer structures may be compared.

It will be appreciated that configurations of the imaging device 105, the viewing station 110, and the simulator 115 described above are merely exemplary, and that a wide variety of variations are possible. For example, some or all of the functions of the imaging device 105 and the simulator 115 may be combined in a single device. Such a unitary device may, for example, acquire images and simulate wafer fabrication processes, either by use of a processor or by other means. Similarly, some or all of the operations of the simulator 115 and the viewing station 110 may be combined in a single device. For example, the processor 250 of the viewing station 110 may be programmed or otherwise configured to perform the simulation of wafer fabrication processes.

It will be further appreciated that multiple devices may be alternatively used in place of any of the single imaging device 105, viewing station 110, and simulator 115. For example, wafer fabrication simulation using image data as an input may be performed by a different device and/or by a different method than wafer fabrication simulation using design data as an input.

Figure 7:
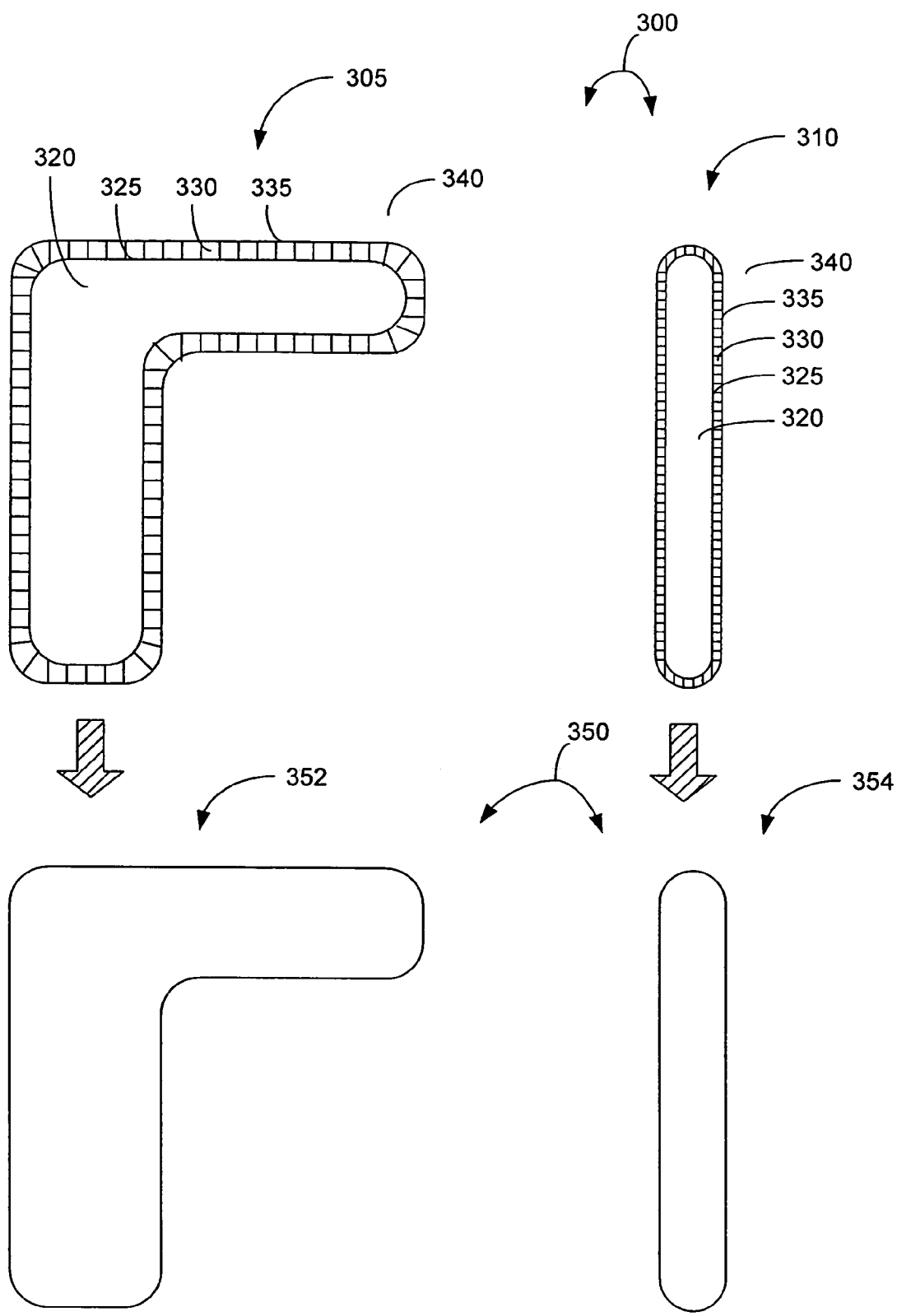
FIG. 7 is a diagram showing a conversion of image data obtained from the imaging device from a first format compatible with the imaging device to second format compatible with the simulator.

Turning now to FIG. 7, a manner in which image data 300 obtained from the mask 107 is transformed into a format suitable for use by the simulator 115 is depicted. The image data 300 obtained from the imaging device 105 includes a representation of the various structures formed on the mask 107. In FIG. 7, the image data 300 is shown to include only two structures 305, 310 for purposes of illustration. As is conventional, a display of the structures 305, 310 on the monitor 225 of the imaging device 105 provides a user with a visual representation of the structures 305, 310 shown with varying degrees of gray scale contrast. The actual gray scale color associated with each portion of the image data 300 is dependent on the number of electrons which are reflected by the structures during the SEM scan. Accordingly, as shown in FIG. 7, each structure 305, 310 is shown to include various regions which are distinguishable from one another due to their varied response to the SEM scan. In particular, the structures 305, 310 include a top surface 320, a top surface edge 325, a downward sloped region 330, an outer edge 335, and a bottom surface 340. The image data 300 obtained from the imaging device 105 is stored in the memory 205 of the imaging device and may be displayed in a conventional fashion on the monitor 225 (FIG. 4). However, in order to use the image data 300 as an input for simulation of a wafer fabrication process, the image data is transformed into a format compatible with use in the simulator 115.

More particularly, in order to convert the image data 300 to a format compatible with the simulator 115, an image analysis algorithm may be applied to the image data 300. The image analysis algorithm may be stored in the memory 205 of the imaging device 105; however, it will be appreciated that the image analysis algorithm alternatively may be stored and applied to the image data 300 at other locations. As shown in FIG. 7, the image analysis algorithm serves to detect various edges of the image data 300 and convert the image data into transformed image data 350 (hereinafter referred to as transformed data 350). For example, in the present embodiment, the image analysis algorithm is configured to detect the outer edge 335 of each of the structures 305, 310 to obtain transformed structures 352 and 354. It will be appreciated, however that the image analysis algorithm could alternatively be configured to detect the top surface edges 325 and/or other features depending on the application at hand. The image analysis algorithm may also binarize the image containing the transformed structures, providing an indication that the areas inside the contours should be clear, opaque, or phase shifting. Further, it will be appreciated that when imaging a mask having both a chrome and quartz region, the image analysis algorithm may be configured to display the quartz region as a semi-transparent colored overlay (e.g. a red overlay) so that a user can easily distinguish between the regions. The binarized image may be suitably scaled. Image analysis algorithms which are suitable for use with the present invention include the APHELION image analysis software formerly available from Amerinex, of Amherst, Mass.

Once converted, the transformed data 350 is stored in a file format which is compatible with the simulator 115. For example, the file format in which the transformed image data may be stored is includes a ".tif", ".jpg", ".bmp", ".bit", ".gif", GDS, Mebes, etc. type file. The format in which the transformed data 350 is stored may, or may not, be in the same format as the design data so long as both formats are compatible for use with the simulator 115. Following such conversion, the transformed data 350 is transferred to the simulator 115. As discussed above, the transformed data 350 may be transferred via the network connection 125, via disk 130 or by other conventional means. It will be appreciated that while the present embodiment depicts transforming the image data 300 at the imaging device 105, it is possible for the image data 305 300 to be transformed at various other locations including at the simulator 115.

It will be appreciated that alternatively the image data 300 may be converted into a format suitable for display by the design viewer, for example so that the image data 300 and design data from the drawing files 257 may be overlaid and simultaneously viewed on the monitor 270. This provides a convenient and simple manner for analyzing the CD variations occurring at any point along each structure.

The simulator 115 further transforms the transformed data 350 to simulate the wafer structure produced by the wafer fabrication process such as a lithography process. For example, an aerial transformation may be performed on the transformed data 350 to take into account anticipated variations which are caused by lens aberrations. Aerial transformation refers to a process by transformed data 350 is modified in advance to account for expected CD variations which will occur due to known lens aberrations or other factors. The expected CD variations are obtainable through known simulation programs such as Solid-C, produced by SIGMA-C of Munich, Germany and therefore further details regarding the manner in which such CD variations are obtained is omitted for sake of brevity. It will be appreciated that the CD variations expected due to the lithography process are dependent upon the details of that process, for example the type of resist, the wavelength of light used to expose the resist, the light intensity and exposure time, and the numerical aperture of the optics utilized.

Figure 8:
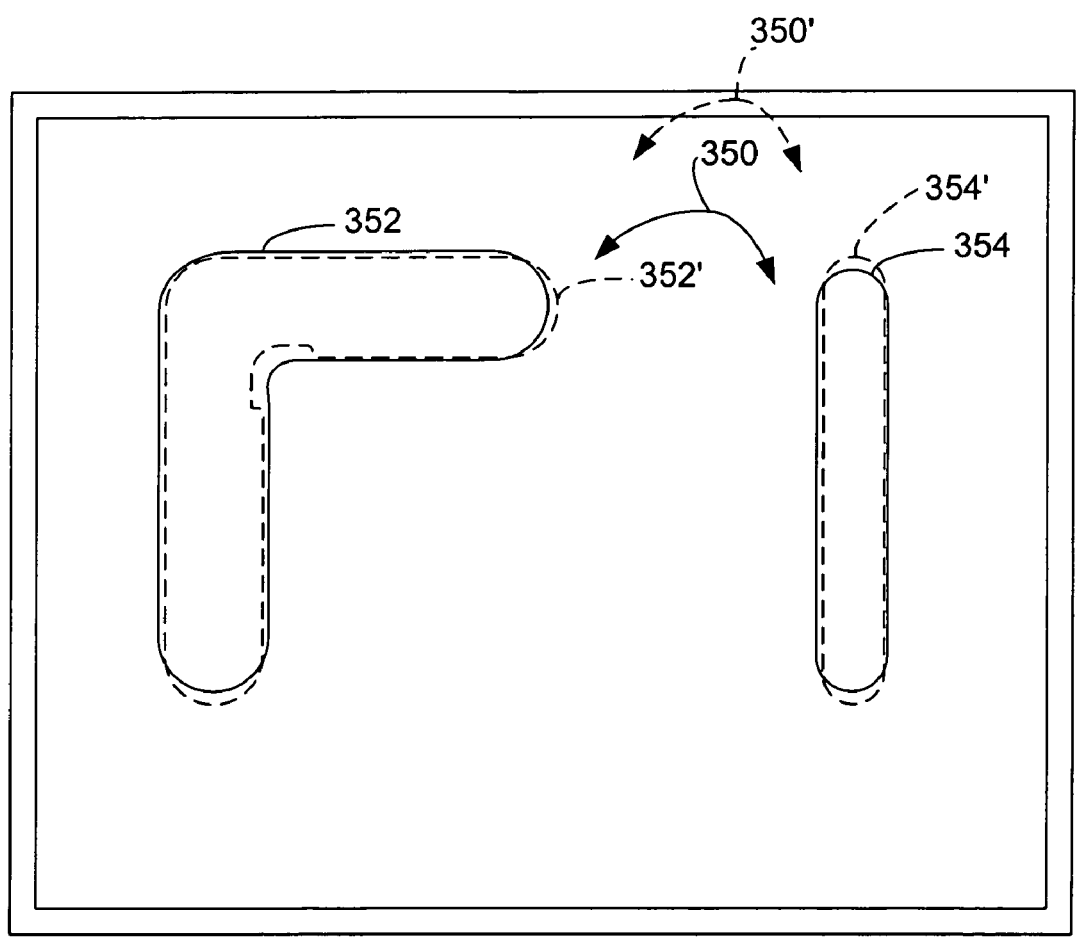
FIG. 8 depicts a transformation of image data by the simulator to simulate wafer fabrication, and thereby to produce a first simulated wafer structure.

As shown in FIG. 8, upon performing an aerial transformation on the transformed mask data 350, a first simulated wafer structure 350' is obtained in which expected CD variations due to lens aberrations, for example, are accounted for as shown. For example, simulated structure elements 352' and 354' have expected CD variation as determined from the simulation program.

Further simulation of the lithographic process may be performed, using the aerial image simulation results. For example, processes in the layer of photoresist may be simulated, using a variety of simulation models.

It will be appreciated that the transformation of the image of the mask 107 to a simulated wafer structure to be expected from wafer fabrication (lithography) processes utilizing the mask alternatively may be obtained by other means. Examples of such other means are the VIRTUAL STEPPER SYSTEM software available from, NUMERICAL TECHNOLOGIES, INC., of San Jose, Calif., and the Aerial Image Measurement System (AIMS) available from Carl Zeiss, Inc.

The VIRTUAL STEPPER SYSTEM takes an image of a mask with an optical microscope or the like for use directly as an input for a simulation program which emulates the optical system used to transfer the mask pattern to a wafer image. The optical parameters of the projection system used in model generation may include wavelength, numerical aperture, coherent factor (sigma), mask to wafer reduction factor, illumination mode, and defocus values.

The AIMS emulates conditions of a stepper by inserting the desired numerical and sigma apertures into the microscope's optical column, and then setting an illuminator for the same wavelength used by the stepper of the wafer fabrication (lithography) process. The mask image was then captured under these pre-determined conditions. The AIMS software analysis then determines simulated wafer structure by simulated resist contour mapping.

Similarly, a second simulated wafer structure 350" (FIG. 9) may be obtained by the simulator 115 transforming design data to simulate the wafer fabrication process. Such a simulation may be performed by an aerial simulation similar to the aerial simulation described above. If desired, it will be appreciated that the design data may transformed, prior to simulating the wafer fabrication process, to simulate differences in critical dimension that may occur in the mask fabrication process. Techniques for simulating the mask fabrication process may be similar to or different from those for simulating the wafer fabrication process.

Figure 9:
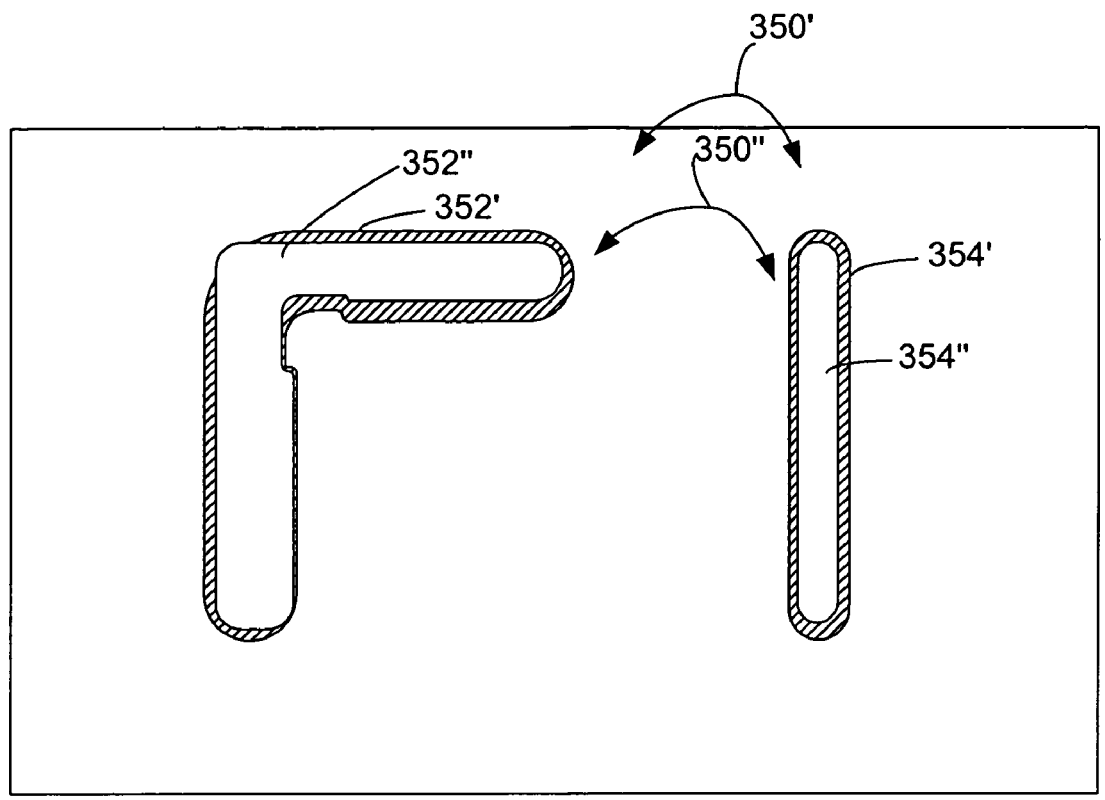
FIG. 9 depicts a monitor of the viewing station in which the first and second simulated wafer structures are displayed in an overlapping manner.

The simulated wafer structures 350' and 350" may be transmitted or otherwise provided, in a suitable data format, to the viewing station 110, where they may be overlaid with one another. More particularly, both sets of data may be viewed via the same design viewer 259. Accordingly, as shown in FIG. 9, upon an operator selecting the desired files to be displayed, the processor 250 displays data representing both the first wafer structure 350' and the second wafer structure 350" in an overlapping fashion (also referred to as an "overlaid image").

It will be appreciated that the contours for the simulated wafer structures 350' and 350" depend on the intensity threshold used in determining whether an amount of light exposure is sufficient to result in a structure on the wafer. The intensity threshold for displaying the contours of the simulated wafer structures 350' and 350" may be the same for each of the structures, or may be different for the two structures. The intensity thresholds may be selected by the operator, or they may be selected automatically via software in the simulator 115 or the viewing station 110. For example, if the average dimension of one of the simulated wafer structures is too large or too small when compared with the other, when both are at the same intensity threshold, it may be desirable to "normalize" the two images by changing one or both intensity thresholds. This may be done by choosing a feature which is relatively insensitive to the wafer fabrication process, for example a long line, and choosing threshold intensities for the two images of simulated wafer structures so as to correspond to a target CD for such a feature.

Figure 10:
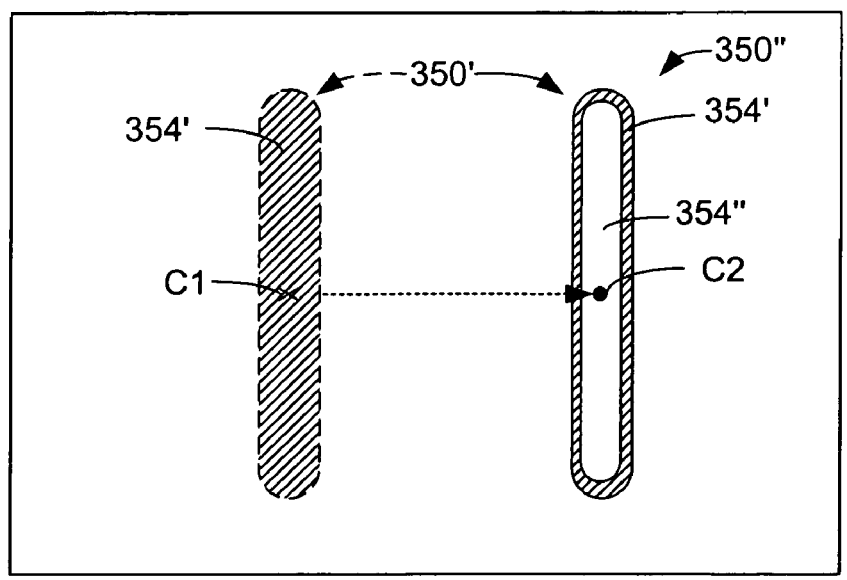
FIG. 10 depicts a referencing system by which the first and second simulated wafer structures may be aligned with one another when displayed on the monitor.

In order to orient and align the simulated wafer structures 350' and 350", the simulated wafer structures may be initially scaled to the same level so that structures may be directly compared. In particular, the simulated wafer structures 350' and 350" may be scaled to a predefined default scaling factor stored in the memory 255 of the viewing station 110 or to a common scaling factor later input by a user via user input 265. For example, each image may be set to a magnification in the range of 30,000× to 80,000×. Once scaled, the processor 250 of the viewing station 110 aligns the simulated wafer structures 350' and 350". For example, as shown in FIG. 10, the first simulated wafer structure 350' may be aligned with the second simulated wafer structure 350" by aligning a center point C1 of a predetermined structure 354' with a center point C2 of a corresponding structure 354". Of course, various other alignment methods, such as anchoring two corners, manual alignment, etc., alternatively may be used.

Once aligned, it is possible directly to compare the simulated wafer structures 350' and 350" with one another. For example, as shown in FIG. 9, it is possible to quickly and accurately determine the amount of rounding, line width variations, and other CD variations which have occurred to the structural elements 305, 310 by directly comparing such images to the overlaid structural elements 352", 354", respectively. Further, the present embodiment allows the operator to initiate automatic computations of CD variations via selected menu driven options.

Figure 11:
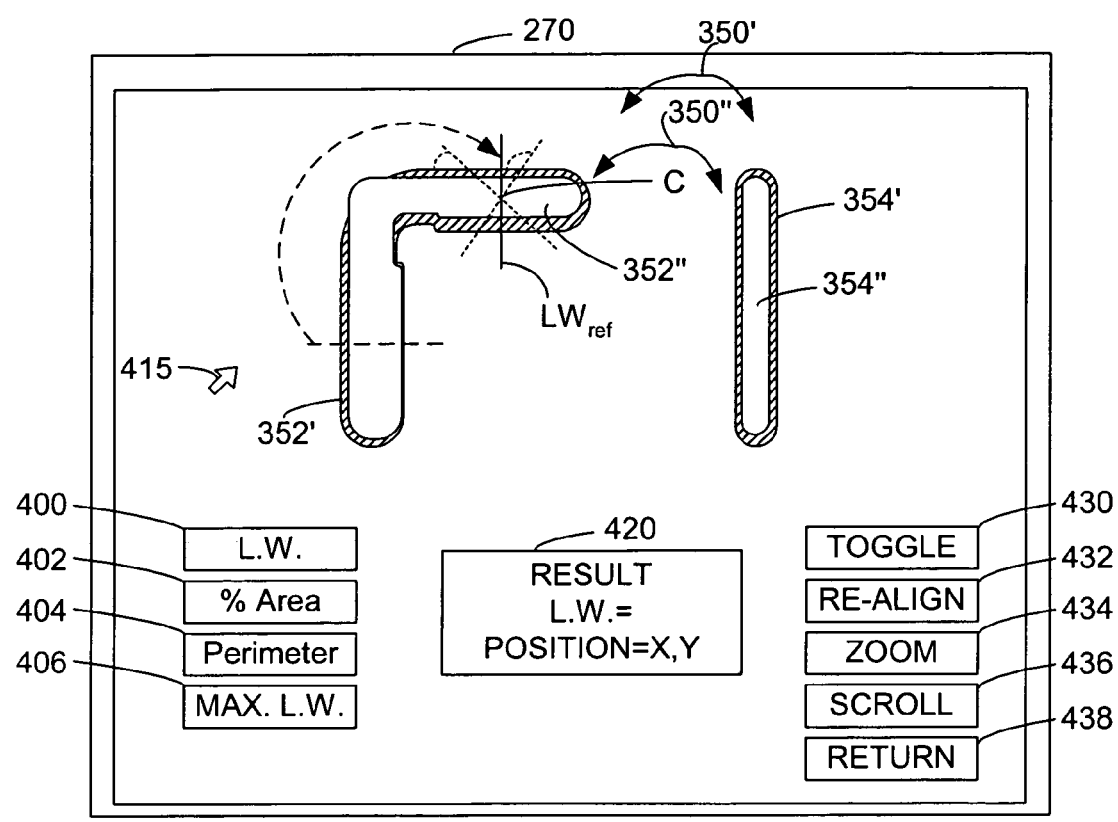
FIG. 11 depicts various menu option available for analyzing critical dimension variations with respect to the simulated wafer structures.

More particularly, as shown in FIG. 11, the present embodiment of the invention allows an operator to analyze CD variations in accordance with one or more various figures of merits (FOM). For example, there is shown to be a line width menu option 400, a percentage area menu option 402 and a perimeter measurement menu option 404.

Upon selecting the line width menu option 400, the processor 250 of the viewing station 110 provides the operator with an opportunity to position a line width reference bar $LW_{ref}$ using a mouse pointer 415. As feature of the present embodiment, the line width reference bar $LW_{ref}$ is preferably controlled by the processor 250 to remain substantially perpendicular to at least one edge of the one of the simulated wafer structures during repositioning using the mouse pointer 415, thereby providing easy manipulation and placement of the line width reference bar $LW_{ref}$ by the operator. Optionally, the line width reference bar $LW_{ref}$ may be controlled to be fully rotatable about its center point C thereby also allowing line width measurements at various oblique angles. A resulting line width variation as measured by the processor 250 is continually output to the operator in the result field 420 even during repositioning of the line width reference bar $LW_{ref}$ thereby providing immediate feedback of CD variations. Alternatively, the resulting line width variation may be output to a storage medium such as a disk, transferred over the network to one or more remote computer systems and/or otherwise handled or stored. Accordingly, the present invention provides a simple and efficient manner of calculating the CD line width variations at any location in the imaging field.

Upon selecting the percentage area menu option 402, the processor 250 of the viewing station 110 provides the operator with an opportunity to select the desired structure on the monitor 270 for which analysis is desired. For example, the operator may opt to select the structural element 352'. The operator may select the structural element 352' by positioning the mouse pointer 415 on the structural element 352' and/or on the overlaid structural element 352" and clicking on the mouse. Alternatively, the present embodiment of the invention allows an operator to select different structures by pressing a tab key or arrow keys on a keyboard. Of course, various other means for selecting the desired structure could also be used. Once selected, the processor 250 compares the transformed structure 352' with the corresponding structure 352" to compute a percentage difference in overall area occupied by the structural element 352'. The resulting percentage difference calculation is output to the operator in the result field 420.

Upon selecting the perimeter measurement option 404, the processor 250 of the viewing station 110 provides the operator with an opportunity to select the desired transformed structure to be analyzed. The manner in which the desired transformed structure may be selected is similar to that described above with respect to selecting a structure for the percentage area calculation. Once selected, the processor 250 is programmed to calculate a line integral comparing a perimeter of the structural element 352' with a perimeter of the corresponding structure 352" to compute a CD variation in accordance with conventional techniques known in the art. The result of the computation is output to the operator in the result field 420.

It will be appreciated that the above comparisons provide a direct means of evaluating the effect of mask fabrication on resulting wafer structures. Many alternative evaluations/analyses are possible. For example, one or both of the simulated wafer structures may be compared to some benchmark, such as a desired or ideal wafer structure design. Simulated wafer structures for different mask patterns may be compared with one another, thereby examining the impact of different mask designs and/or mask fabrication methods. Further, parameters in the wafer fabrication simulation may be varied, thereby allowing examination of the impact of mask design for various types of wafer fabrication processes.

While the present embodiment of the invention depicts three different FOMs from which to an operator may select to analyze the simulated wafer structures, it will be appreciated that various other FOMs may alternative be used and the present invention is not limited to the examples provided above. Other evaluation techniques include, for example, those described in "Evaluation of Proximity Effects Using Three-Dimensional Optical Lithography Simulation", Chris A. Mack, SPIE Vol. 2726, pages 634–39, Optical Microlithograhy IX (1996), which is incorporated herein by reference in its entirety. Additionally, the present embodiment allows for enhanced features such as automatic detection of maximum line width variations. For example, upon selecting the maximum line width variation option 406, the processor 250 automatically reviews the selected transformed structure on the monitor 270 to determine the location of the maximum line width variation. In particular, the processor 250 performs a line width variation calculation at each location across the selected structure to determine the location providing the greatest variation. The location determined by the processor 250 is graphically depicted to the user by automatically placing the line width reference bar $LW_{ref}$ at the location computed. Once the line width reference bar $LW_{ref}$ is placed at the location computed, the resultant line width variation is also provided to the user in the result field 420. Accordingly, the present embodiment provides for a large number of options for quickly and fully analyzing CD variations of structures formed on a semiconductor wafer.

In addition to the CD analysis menu options, the present embodiment also provides several additional features for controlling and manipulating the overlaid images. For example, continuing to refer to FIG. 11, additional menu options which are provided to the operator include, for example, an overlay toggle key 430, a manual realignment key 432, a zoom key 434, a scroll screen key 436, and a return key 438.

The overlay toggle key 430 is configured by the processor 250 to allow a user to toggle between selecting the first simulated wafer structure 350' and the second wafer structure 350" on the monitor 270. As described below, such a feature is beneficial when manipulation of only one of the two layers is desired at a given time. The manual realignment key 432 is configured by the processor 250 to allow for moving the layer selected by the toggle key 430 so as to realign the overlay layers to a desired degree. For example, once the manual realignment key 432 is selected, the operator may type in a desired offset by which to move the selected layer and/or may use the mouse to drag the selected layer to a desired locations on the monitor 270.

The zoom key 434 is configured by the processor 250 to allow for zooming in or out of the images shown on the monitor 270. Preferably, when zooming in or out, both layers are simultaneously modified in size. However, it will be appreciated that the present embodiment optionally allows for zooming in or out of one layer at a time. The scroll screen key 436 is configured by the processor 250 to provide for panning to various locations in the overlaid layer so as to display different portions on the monitor 270. The return key 438 is configured by the processor 250 to allow for automatically returning the operator to default overlay setting so that the operator need not manually attempt to undo modifications implemented. It will be appreciated that the present embodiment allows for these and other functions to operate in conjunction with the overlay images displayed by the design viewer.

In addition to overlaying the two images discussed above, it will be appreciated that three or more images may be simultaneously displayed and compared on the same design viewer 259. For example, in one embodiment it may be desirable to overlay the images of structures formed at various stages and layers on the wafer. Such stages and layer may include a CAD image of a structure overlaid with a corresponding image of the structure formed on the reticle, which is further overlaid with a corresponding image of the structure formed in the photoresist, which is still further overlaid with a corresponding image of the structure formed on the wafer following etching, etc. It will be appreciated, that these and other embodiments are within the scope of the present invention.

Figure 12:
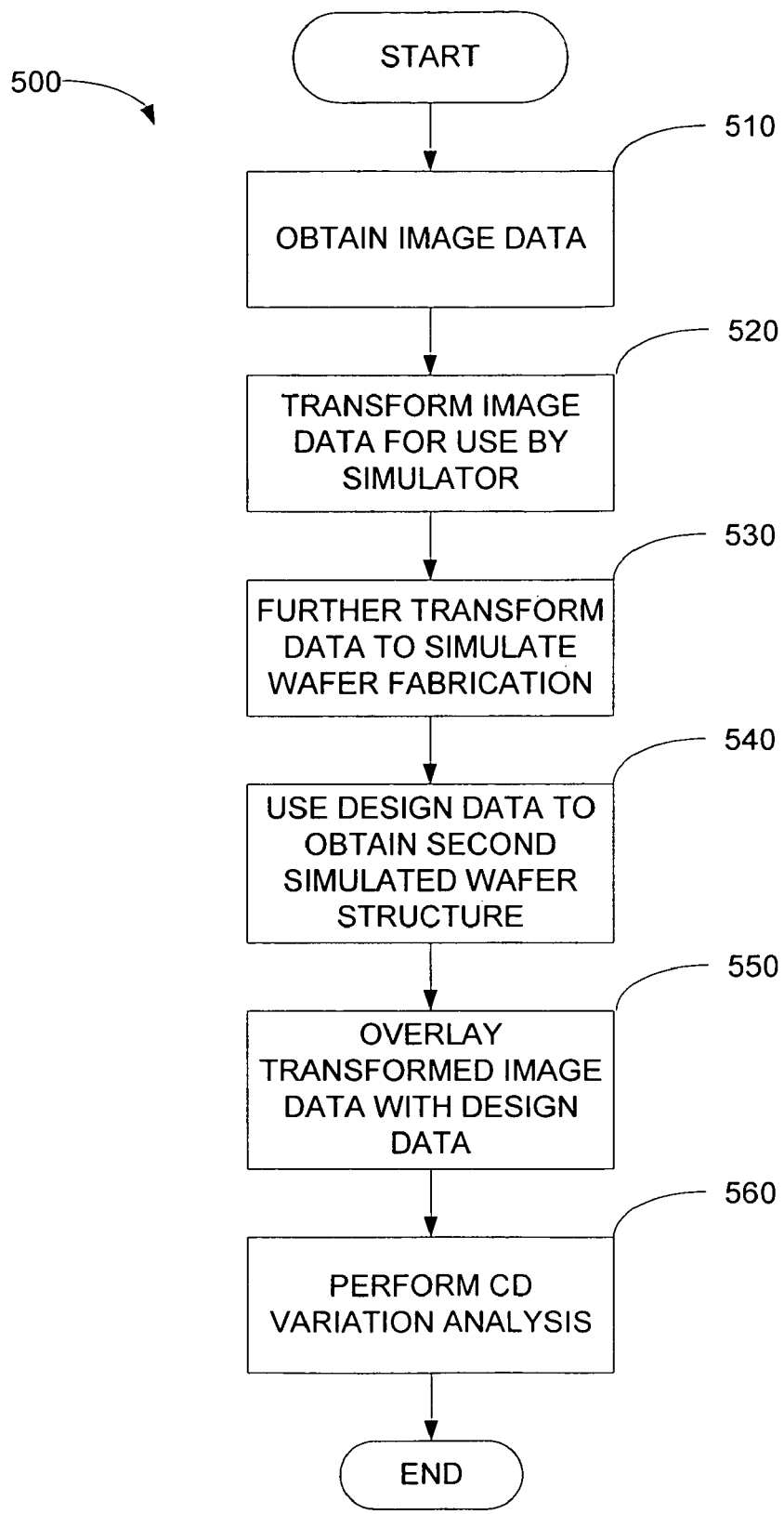
FIG. 12 is a flow chart depicting the steps taken to perform critical dimension analysis in accordance with the present invention.

Referring now to FIG. 12, a flowchart is shown depicting the various steps associated with an analysis method 500 such as described above. Beginning at step 510, image data is initially obtained by the imaging device 110 so as to obtain the image data 300 representative of the structures formed on the mask 107. As discussed above, the image data 300 may be obtained using an SEM, AFM or other imaging device. The image data 300 may be, for example, an image of the structures formed on an mask/reticle or an image taken of a mask. Next, in step 520, the image data 300 obtained from the imaging device 110 is converted to transformed data 350 by application of an image analysis algorithm. Then, in step 530, the simulator 115 further transforms the transformed data 350 to simulate the wafer structure produced by the wafer fabrication process such as a lithography process, thereby obtaining data for a first simulated wafer structure 350'. In step 540, the simulator 115 simulates the wafer structure produced by the wafer fabrication process, using design data as an input, thereby obtaining data for a second simulated wafer structure 350". In step 550, the simulated wafer processes 350' and 350" are displayed overlaid on one another. As part of this step, the processor 250 may be configured to automatically align simulated wafer structures, and/or automatically adjust the threshold intensities used in determining the contours of the simulated wafer structures. In step 560, the operator may performs CD variation analysis by selecting the desired FOM and manipulating the images on the monitor 270 in accordance with the menu options available. In this manner a convenient and easy to use CD variation tool is provided which allows for a complete analysis of variations occurring on the simulated wafer structures. Based on the results of the CD variation analysis, the operator may then modify one or more steps or devices to account for CD variations detected.

It will be appreciated that many of the variations and alternative method steps disclosed earlier may used in alternative methods to those described in the preceding paragraph. Further, it will be appreciated that some of the method steps may be omitted and/or automated, if desired. For example, the acquisition of CD variation analysis, either between the various simulated wafer structures, or between the structures and an desired (ideal) design, may be performed by an algorithm, without the need to display the simulated wafer structures.

The invention, then, provides an enhanced analysis tool for examining the expected impact of various steps (for example, mask fabrication) of a wafer manufacturing process, on ultimate wafer structure designs. By examining the impact on simulated wafer structures, the spatial filtering aspect of optical lithography may be taken into account in evaluating mask fabrication processes and in evaluating the impact of proposed optical proximity correction. Moreover, the impact of mask fabrication methods for various proposed lithography processes may be cheaply and easily examined by varying the parameters of the wafer fabrication simulation.

Although the invention has been shown and described with respect to a certain embodiment or embodiments, it is obvious that equivalent alterations and modifications will occur to others skilled in the art upon the reading and understanding of this specification and the annexed drawings. For example, while the above discussion involved use of menu options to select criteria for performing CD analysis, it will be appreciated that the operator may input commands via alternative methods. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of analyzing a mask manufacturing process, the method comprising:
   imaging at least a portion of a mask to be used in a wafer structure formation process;
   simulating lithographic processing using data received from or derived from the imaging of the portion of the mask, thereby obtaining a first simulated wafer structure;
   simulating lithographic processing using mask design data corresponding to the imaged portion of the mask as an input, thereby obtaining a second simulated wafer structure;
   comparing the first simulated wafer structure to the second simulated wafer structure;
   comparing the first and second simulated wafer structures to an ideal wafer structure representing the desired structure on a fabricated wafer to be transferred by the mask; and
   based on the comparing steps, evaluating critical dimension variations across the wafer structure.

2. The method of claim 1, where first and second simulated wafer structures are obtained by the same simulation method.

3. The method of claim 1, where first and second simulated wafer structures are obtained by aerial image simulation.

4. The method of claim 1, where first and second simulated wafer structures are obtained by different simulation methods.

5. The method of claim 1, further comprising displaying the first simulated wafer structure on a display screen.

6. The method of claim 5, further comprising displaying the second simulated wafer structure on the display screen, wherein the first and second simulated wafer structures at least partially overlap with one another.

7. The method of claim 6, providing a user an option of selecting a figure of merit (FOM) by which critical dimension variations between the simulated wafer structures are to be calculated.

8. The method of claim 7, wherein the FOM is a line width.

9. The method of claim 7, wherein the FOM is a percentage difference in overall area of the first and second simulated structures.

10. The method of claim 1, wherein the imaging includes using a scanning electron microscope (SEM) to obtain an SEM image.

11. The method of claim 10, further comprising transforming the SEM image into computer-readable data.

12. The method of claim 11, wherein the transforming includes applying an image analysis algorithm to the image data.

13. The method of claim 11, further comprising scaling the data.

14. The method of claim 1, further comprising transforming data of a first type, obtained in the imaging, into data of a second type, to be used in the simulating.

15. The method of claim 1, wherein the simulating includes aerial simulation using a computer program.

16. The method of claim 15, wherein the simulating also includes simulating the developed resist image.

17. The method of claim 1, wherein the simulating includes simulating using an aerial image microscope system.

18. The method of claim 1, further comprising forming at least one of the first and second simulated wafer structures at various stages of the wafer structure formation process, and overlaying all of the simulated wafer structures on a display screen.

19. The method of claim 1, further comprising determining a location of greatest critical dimension variation between the first and second simulated wafer structures.

* * * * *